(12) United States Patent
Forthun

(10) Patent No.: US 6,262,895 B1
(45) Date of Patent: Jul. 17, 2001

(54) STACKABLE CHIP PACKAGE WITH FLEX CARRIER

(76) Inventor: John A. Forthun, 1109 La Flora La., Glendora, CA (US) 91741

(*) Notice: Subject to any disclaimer, the term of this patent is extended or adjusted under 35 U.S.C. 154(b) by 0 days.

(21) Appl. No.: 09/482,294

(22) Filed: Jan. 13, 2000

(51) Int. Cl.⁷ .................................................. H05K 1/00
(52) U.S. Cl. .......................... 361/749; 361/719; 361/803; 257/707; 439/69
(58) Field of Search ................................. 361/749, 750, 361/751, 803, 720, 719, 774; 257/686, 707; 439/69

(56) References Cited

U.S. PATENT DOCUMENTS

| | | | |
|---|---|---|---|
| 3,746,934 | 7/1973 | Stein | 317/101 CM |
| 4,833,568 | * 5/1989 | Berhold | 361/383 |
| 4,956,694 | 9/1990 | Eide | 357/74 |
| 5,198,888 | 3/1993 | Sugano et al. | 257/686 |
| 5,375,041 | * 12/1994 | McMahon | 361/749 |
| 5,514,907 | 5/1996 | Moshayedi et al. | 257/723 |
| 5,612,570 | 3/1997 | Eide et al. | 257/686 |
| 5,776,797 | * 7/1998 | Nicewarner, Jr. et al. | 438/107 |
| 5,869,353 | 2/1999 | Levy et al. | 438/109 |
| 5,926,369 | * 7/1999 | Ingraham et al. | 361/699 |
| 6,014,316 | * 1/2000 | Eide | 361/735 |
| 6,172,874 | * 1/2001 | Bartilson | 361/719 |

FOREIGN PATENT DOCUMENTS 4209562   7/1992 (JP).

* cited by examiner

*Primary Examiner*—Tulsidas Patel
*Assistant Examiner*—Hae Moon Hyeon
(74) *Attorney, Agent, or Firm*—Stetina Brunda Garred & Brucker

(57) ABSTRACT

A stackable integrated circuit chip package comprising a flex circuit. The flex circuit itself comprises a flexible substrate having opposed, generally planar top and bottom surfaces. Disposed on the top surface is a first conductive pad array, while disposed on the bottom surface is a second conductive pad array and third and fourth conductive pad arrays which are positioned on opposite sides of the second conductive pad array and electrically connected thereto. The chip package further comprises an integrated circuit chip which is electrically connected to the first and second conductive pad arrays, and hence to the third and fourth conductive pad arrays. The substrate is wrapped about at least a portion of the integrated circuit chip such that the third and fourth conductive pad arrays collectively define a fifth conductive pad array which is electrically connectable to another stackable integrated circuit chip package.

15 Claims, 3 Drawing Sheets

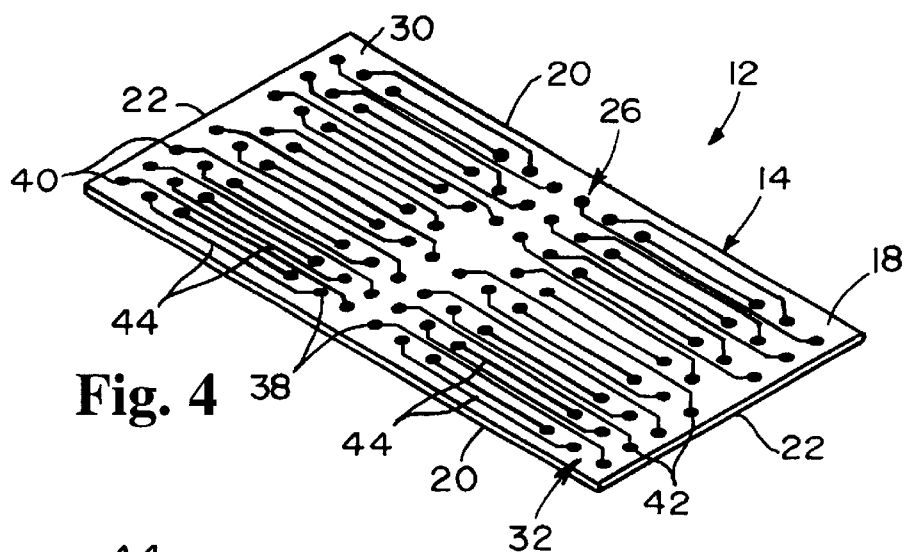
Fig. 4
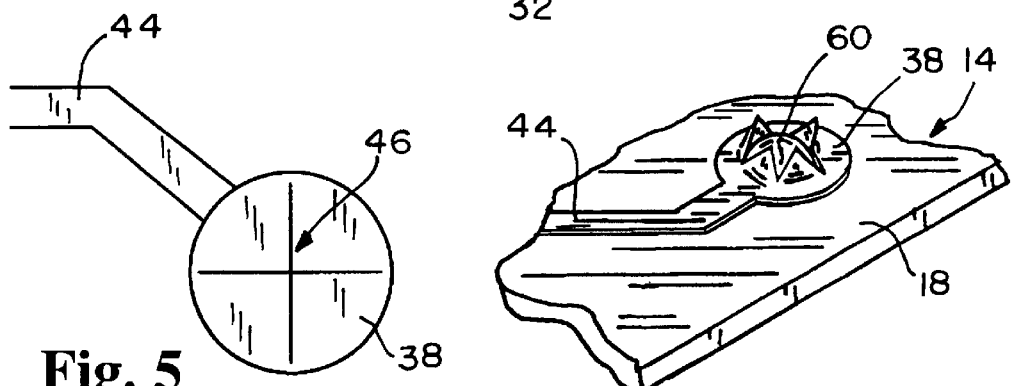
Fig. 5
Fig. 6
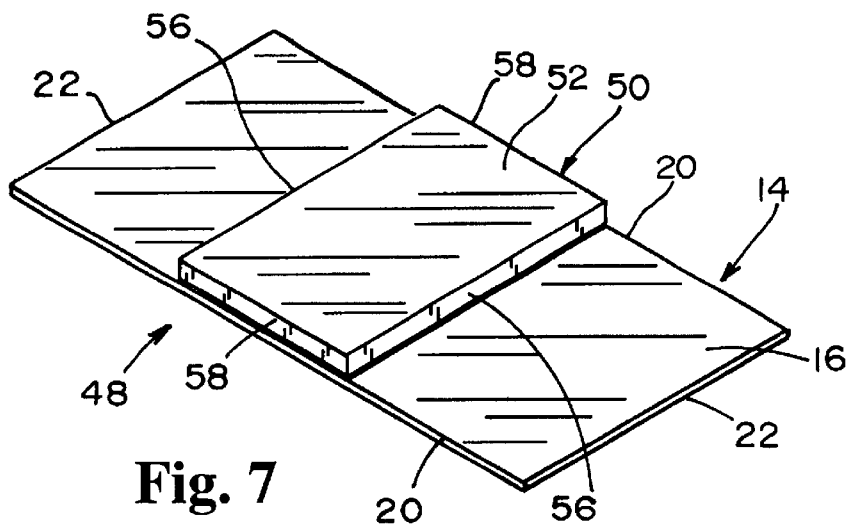
Fig. 7

STACKABLE CHIP PACKAGE WITH FLEX CARRIER

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to chip stacks, and more particularly to a stackable integrated circuit chip package including a flex circuit which allows multiple chip packages to be quickly, easily and inexpensively assembled into a chip stack having a minimal profile.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U. S. Pat. No. 5,612,570 entitled CHIP STACK AND METHOD OF MAKING SAME issued Mar. 18, 1997, and U. S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a chip stack which involves the use of stackable integrated circuit chip packages including flex circuits. The inclusion of the flex circuits in the chip packages of the present invention provides numerous advantages in the assembly of the chip stack, including significantly greater ease in achieving and maintaining the alignment between the chip packages within the stack. Additionally, the use of the flex circuits allows for the assembly of the chip packages into a chip stack which has a minimal profile.

BRIEF SUMMARY OF THE INVENTION

In accordance with the present invention, there is provided a stackable integrated circuit chip package. The chip package comprises a flex circuit which itself comprises a flexible substrate having opposed, generally planar top and bottom surfaces. The substrate is preferably fabricated from a polyamide which has a thickness of several mils or less, and may have a thickness down to about 1 mil. The substrate preferably has a generally rectangular configuration defining a pair of longitudinal peripheral edge segments and a pair of lateral peripheral edge segments. Disposed on the top surface of the substrate is a first conductive pad array, while disposed on the bottom surface is a second conductive pad array. The first and second conductive pad arrays extend between the longitudinal peripheral edge segments in spaced relation to the lateral peripheral edge segments. Also disposed on the bottom surface of the substrate on opposite sides of the second conductive pad array are third and fourth conductive pad arrays which extend between the longitudinal peripheral edge segments along respective ones of the lateral peripheral edge segments. The third and fourth conductive pad arrays are each electrically connected to the second conductive pad array.

In the chip package of the present invention, the first conductive pad array preferably comprises a first set of pads, with the second conductive pad array preferably comprising a second set of pads which are arranged in an identical pattern to the first set of pads such that the pads of the first set are aligned (i.e., in registry with) respective ones of the pads of the second set. Similarly, the third conductive pad array comprises a third set of pads, with the fourth conductive pad array comprising a fourth set of pads. The third and fourth sets of pads are preferably arranged on the bottom surface of the substrate in patterns which are mirror images to each other. The pads of the third and fourth sets are electrically connected to respective ones of the pads of the second set through the use of conductive tracings.

The pads of the first through fourth sets and conductive tracings are preferably fabricated from very thin copper having a thickness in the range of from about 5 microns to about 25 microns through the use of conventional etching techniques. Advantageously, the use of the thin copper for the pads and conductive tracings allows for etching line widths and spacings down to a pitch of about 4 mils which substantially increases the routing density. The pads and tracings collectively define a conductive pattern of the flex circuit. Extending through the substrate between respective pairs of the pads of the first and second sets are a plurality of cross-slits, the use of which will be described in more detail below.

In addition to the flex circuit, the chip package of the present invention comprises an integrated circuit chip which is electrically connected to the first and second conductive pad arrays, and hence to the third and fourth conductive pad arrays by virtue of their electrical connection to the second conductive pad array via the conductive tracings. The integrated circuit chip preferably comprises a flip chip device or a fine pitch BGA (ball grid array) device having a body which is of a generally rectangular configuration defining opposed, generally planar top and bottom surfaces, a pair of longitudinal sides, and a pair of lateral sides. Protruding from the bottom surface of the body are a plurality of generally semi-spherically shaped conductive contacts which are preferably arranged in an identical pattern to the first and second sets of pads. In the present chip package, the electrical connection of the integrated circuit chip to the first and second conductive pad arrays is facilitated by the insertion of the conductive contacts into the cross-slits of respective ones of the pads of the first set, and advancement therethrough to protrude from respective ones of the pads of the second set and hence the bottom surface of the substrate.

In the chip package of the present invention, the substrate is wrapped about at least a portion of the integrated circuit chip such that the third and fourth conductive pad arrays collectively define a fifth conductive pad array which is electrically connectable to another stackable integrated circuit chip package. The fifth conductive pad array comprises the third and fourth sets of pads which, when the substrate is wrapped about the integrated circuit chip, are arranged in an identical pattern to the first and second sets of pads. The substrate is wrapped about the longitudinal sides of the body such that the fifth conductive pad array extends over the top surface of the body and the third and fourth sets of pads making up the fifth conductive pad array are in substantial alignment or registry with respective pairs of the first and second sets of pads.

The substrate is preferably sized relative to the integrated circuit chip such that the lateral peripheral edge segments of the substrate extend along the top surface of the body in generally parallel relation to each other and are separated by a narrow gap, with the lateral sides of the body being substantially flush with respective ones of the longitudinal peripheral edge segments of the substrate. As such, the integrated circuit chip is positioned upon the central portion of the substrate (which includes the first and second conductive pad arrays thereon), with the opposed end portions of the substrate (which include the third and fourth conductive pad arrays thereon) being wrapped about the integrated circuit chip so as to cover the top surface of the body thereof. These end portions of the substrate are preferably attached to the top surface of the body through the use of an adhesive. Additionally, the chip package may be provided with a pair of heat sinks which are attached to respective ones of the lateral sides of the body of the integrated circuit chip.

In addition to the end portions of the substrate being adhesively secured to the top surface of the body of the integrated circuit chip, the conductive contacts of the integrated circuit chip are preferably soldered to respective ones of the pads of the second set. In this respect, each of the conductive contacts may be pre-coated with solder paste or flux prior to the placement of the integrated circuit chip upon the first conductive pad array, with the application of heat to the chip package subsequent to the flex circuit being wrapped about the integrated circuit chip effectuating the soldering of the conductive contacts to the second set of pads, and hence the conductive pattern of the flex circuit.

Advantageously, those portions of the conductive contacts protruding from the pads of the second set and hence the bottom surface of the substrate may be electrically connected to respective ones of the conductive pads of a printed circuit board, or to respective ones of the third and fourth sets of pads of the fifth conductive pad array of another identically configured stackable integrated circuit chip package. In this respect, multiple chip packages of the present invention may be stacked upon one another, with solder paste or flux being pre-applied to the third and fourth sets of pads of the fifth conductive pad array prior to the stacking of another chip package thereupon such that the subsequent application of heat to the stack facilitates the desired electrical connection of the chip packages to each other. The engagement between the exposed portions of the conductive contacts and the third and fourth sets of pads of the fifth conductive pad array performs a self-aligning function during the soldering process, thus simply requiring that the longitudinal and lateral edges of the chip packages in the stack be aligned with each other prior to the application of heat thereto.

Those of ordinary skill in the art will recognize that the flex circuit need not necessarily be provided with the first conductive pad array in that the conductive contacts of the integrated circuit chip may be advanced through the cross-slits within the substrate and electrically mounted via soldering to only the pads of the second set forming the second conductive pad array. Additionally, the flex circuit may be adapted to be usable in conjunction with a bare die device by eliminating the cross-slits and electrically connecting the pads of the first set forming the first conductive pad array to respective ones of the pads of the second set forming the second pad array through the use of vias.

BRIEF DESCRIPTION OF THE DRAWINGS

These, as well as other features of the present invention, will become more apparent upon reference to the drawings wherein:

FIG. 4 is a top perspective view of the bottom surface of the flex circuit of the present chip package, the top surface thereof being perspectively shown in FIG. 2;

FIG. 5 is an enlarged view of one of the conductive pads of the flex circuit;

FIG. 6 is a partial perspective view of the present chip package, illustrating the manner in which the integrated circuit chip thereof is electrically connected to the conductive pattern of the flex circuit;

FIG. 7 is a top perspective view illustrating an initial step in the sequence of assembling the present chip package;

DETAILED DESCRIPTION OF THE INVENTION

Figure 1:
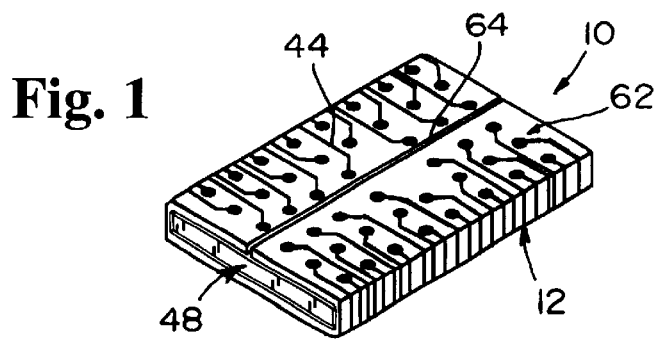
FIG. 1 is a top perspective view of the stackable integrated circuit chip package constructed in accordance with the present invention.
Figure 2:
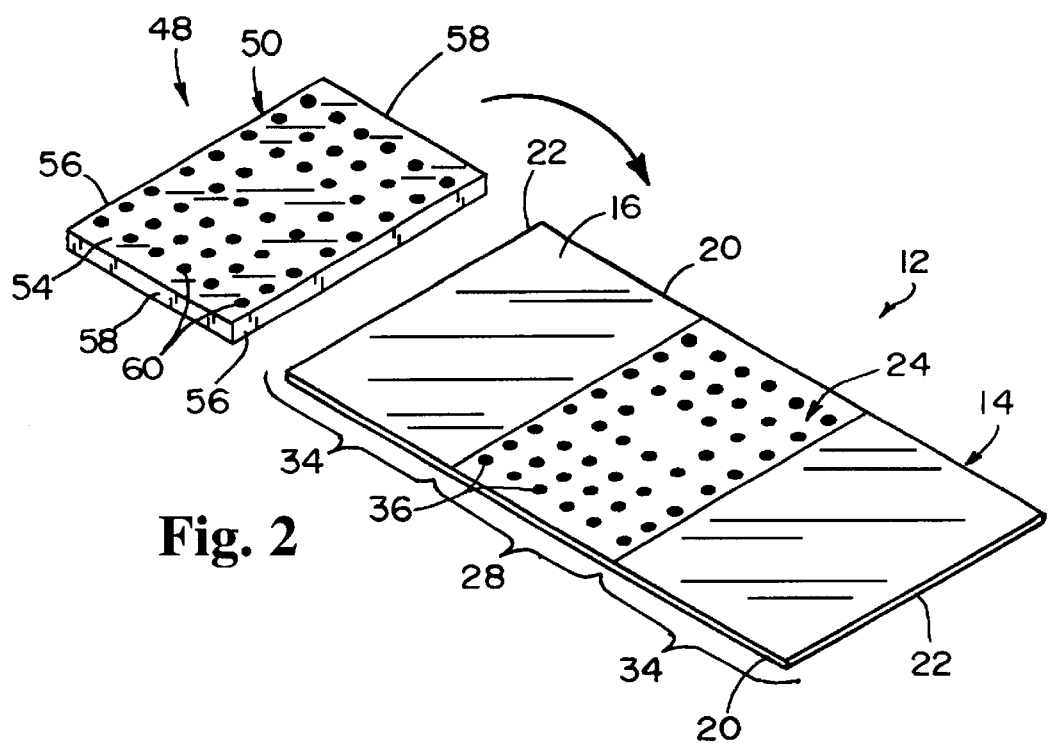
FIG. 2 is a top perspective view of the flex circuit and integrated circuit chip components of the chip package shown in FIG. 1.

Referring now to the drawings wherein the showings are for purposes of illustrating a preferred embodiment of the present invention only, and not for purposes of limiting the same, FIG. 1 perspectively illustrates a stackable integrated circuit chip package 10 constructed in accordance with the present invention. Referring now to FIGS. 2 and 4, the chip package 10 comprises a flex circuit 12 which itself comprises a flexible substrate 14 having a generally planar top surface 16 and a generally planar bottom surface 18. The substrate 14 preferably has a generally rectangular configuration defining a pair of longitudinal peripheral edge segments 20 and a pair of lateral peripheral edge segments 22. The substrate 14 is preferably fabricated from a polyamide which has a thickness of several mils or less, and may have a thickness down to about 1 mil.

Disposed on the top surface 16 of the substrate 14 is a first conductive pad array 24, while disposed on the bottom surface 18 is a second conductive pad array 26. The first and second conductive pad arrays 24, 26 are located upon a central portion 28 of the substrate 14 and extend between the longitudinal peripheral edge segments 20 in spaced relation to the lateral peripheral edge segments 22. Also disposed on the bottom surface 18 of the substrate 14 on opposite sides of the second conductive pad array 26 is a third conductive pad array 30 and a fourth conductive pad array 32. The third and fourth conductive pad arrays 30, 32 are located upon respective ones of an opposed pair of end portions 34 of the substrate 14 and extend between the longitudinal peripheral edge segments 20 along respective ones of the lateral peripheral edge segments 22. The third and fourth conductive pad arrays 30, 32 are each electrically connected to the second conductive pad array 26 in a manner which will be described in more detail below.

In the chip package 10, the first conductive pad array 24 preferably comprises a first set of pads 36, with the second conductive pad array 26 preferably comprising a second set of pads 38 which are arranged in an identical pattern to the first set of pads 36 such that the pads 36 of the first set are aligned (i.e., in registry with) respective ones of the pads 38 of the second set. Similarly, the third conductive pad array 30 comprises a third set of pads 40, with the fourth conductive pad array 32 comprising a fourth set of pads 42. The third and fourth sets of pads 40, 42 are preferably arranged on the bottom surface 18 of the substrate 14 in patterns which are mirror images to each other. The pads 40, 42 of the third and fourth sets are electrically connected to respective ones of the pads 38 of the second set through the use of conductive tracings 44.

The pads 36, 38, 40, 42 of the first through fourth sets and conductive tracings 44 are preferably fabricated from very thin copper having a thickness in the range of from about 5 microns to about 25 microns through the use of conventional etching techniques. Advantageously, the use of the thin copper for the pads 36, 38, 40, 42 and conductive tracings 44 allows for etching line widths and spacings down to a pitch of about 4 mils which substantially increases the routing density on the flex circuit 12. The pads 36, 38, 40, 42 and conductive tracings 44 collectively define a conductive pattern of the flex circuit 12. As seen in FIG. 5, extending through the substrate 14 between respective pairs of the pads 36, 38 of the first and second sets are a plurality of cross-slits 46, the use of which will be described in more detail below.

Figure 3:
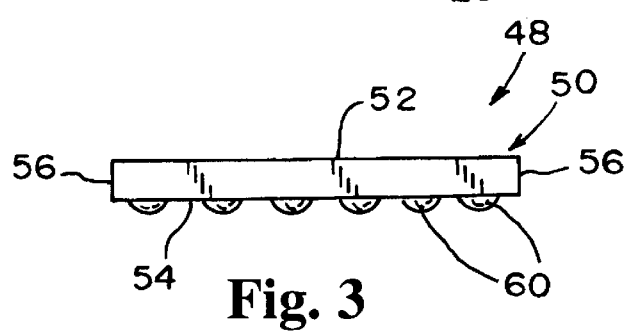
FIG. 3 is a side-elevational view of the integrated circuit chip shown in FIG. 2.

Referring now to FIGS. 2 and 3, in addition to the flex circuit 12, the chip package 10 of the present invention comprises an integrated circuit chip 48 which is electrically connected to the first and second conductive pad arrays 24, 26, and hence to the third and fourth conductive pad arrays 30, 32 by virtue of their electrical connection to the second conductive pad array 26 via the conductive tracings 44. The integrated circuit chip 48 preferably comprises a flip chip device or a fine pitch BGA (ball grid array) device, and includes a rectangularly configured body 50 defining a generally planar top surface 52, a generally planar bottom surface 54, a pair of longitudinal sides 56, and a pair of lateral sides 58. Protruding from the bottom surface 54 of the body 50 are a plurality of generally semi-spherically shaped conductive contacts 60 which are preferably arranged in an identical pattern to each of the first and second sets of pads 36, 38. As seen in FIGS. 5 and 6 and as will also be discussed in more detail below, in the chip package 10, the electrical connection of the integrated circuit chip 48 to the first and second conductive pad arrays 24, 26 is facilitated by the insertion of the conductive contacts 60 into the cross-slits 46 of respective ones of the pads 36 of the first set, and advancement therethrough to protrude from respective ones of the pads 38 of the second set and hence the bottom surface 18 of the central portion 28 of the substrate 14.

Figure 8:
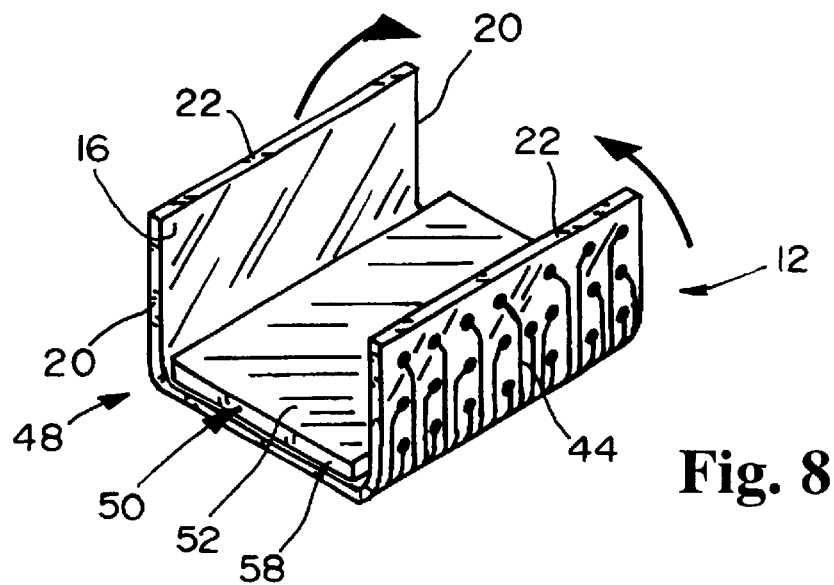
FIG. 8 is a perspective view illustrating one of the steps in the sequence of assembling the present chip package.

As best seen in FIGS. 1 and 8, in the chip package 10 of the present invention, the flex circuit 12, and more particularly the substrate 14 thereof, is wrapped about at least a portion of the integrated circuit chip 48 such that the third and fourth conductive pad arrays 30, 32 collectively define a fifth conductive pad array 62 which is electrically connectable to another stackable integrated circuit chip package 10. The fifth conductive pad array 62 comprises the third and fourth sets of pads 40, 42 which, when the substrate 14 is wrapped about the integrated circuit chip 48, are arranged in an identical pattern to each of the first and second sets of pads 36, 38. The substrate 14 is wrapped about the longitudinal sides 56 of the body 50 of the integrated circuit chip 48 such that the fifth conductive pad array 62 extends over the top surface 52 of the body 50 and the third and fourth sets of pads 40, 42 making up the fifth conductive pad array 62 are in substantial alignment or registry with respective pairs of the first and second sets of pads 36, 38. As such, in assembling the chip package 10, the integrated circuit chip 48 is initially positioned upon the top surface 16 of the central portion 28 of the substrate 14, with the opposed end portions 34 of the substrate 14 thereafter being wrapped about the integrated circuit chip 48 so as to substantially cover the top surface 52 of the body 50 thereof.

As is most apparent from FIG. 1, the substrate 14 is preferably sized relative to the integrated circuit chip 48 such that when the substrate 14 is wrapped about the integrated circuit chip 48, the lateral peripheral edge segments 22 extend along the top surface 52 of the body 50 in generally parallel relation to each other and are separated by a narrow gap 64, and the lateral sides 58 of the body 50 are substantially flush with respective ones of the longitudinal peripheral edge segments 20 of the substrate 14. As will be recognized, the top surface 16 of the substrate 14 at the end portions 34 thereof is in direct, abutting contact with the body 50 of the integrated circuit chip 48. The end portions 34 of the substrate 14 are preferably attached to the top surface 52 of the body 50 through the use of an adhesive. Additionally, as seen in FIG. 10, since the substrate 14 is wrapped about only the longitudinal peripheral edge segments 20 of the body 14 thus leaving the lateral peripheral edge segments 22 uncovered, the chip package 10 may be provided with a pair of heat sinks 66 which are attached to respective ones of the lateral sides 58 of the body 50 of the integrated circuit chip 48.

In addition to the end portions 34 of the substrate 14 being adhesively secured to the top surface 52 of the body 50 of the integrated circuit chip 48, the conductive contacts 60 of the integrated circuit chip 48 are preferably soldered to respective ones of the pads 38 of the second set. To facilitate such soldering, each of the conductive contacts 60 may be pre-coated with solder paste or flux prior to the placement of the integrated circuit chip 48 upon the first conductive pad array 24, with the application of heat to the chip package 10 subsequent to the flex circuit 12 being wrapped about the integrated circuit chip 48 effectuating the soldering of the conductive contacts 60 to the second set of pads 38, and hence the conductive pattern of the flex circuit 12.

As is apparent from the aforementioned discussion regarding the structural attributes of the chip package 10, the preferred method of assembling the same comprises the initial step of fabricating the flex circuit 12 to include a desired conductive pattern thereon. The integrated circuit chip 48 is then positioned upon the first conductive pad array 24 in the above-described manner, with sufficient pressure being applied to the body 50 of the integrated circuit chip 48 as is needed to facilitate the advancement of the conductive contacts 60 thereof through the cross-slits 46 so as to protrude from the pads 38 of the second set. As indicated above, the conductive contacts 60 of the integrated circuit chip 48 are preferably pre-coated with solder paste or flux. Thereafter, the substrate 14 of the flex circuit 12 is tightly wrapped about the body 50 of the integrated circuit chip 48 in the above-described manner, with the end portions 34 of the substrate 14 then being adhesively secured to the top surface 52 of the body 50 to facilitate the formation of the fifth conductive pad array 62 which extends over the top surface 52 of the body 50. As will be recognized, the second conductive pad array 26 extends over the bottom surface 54 of the body 50, as does the first conductive pad array 24. However, only the second and fifth conductive pad arrays 26, 62 are exposed due to the manner in which the substrate 14 is wrapped about the integrated circuit chip 48. As will be discussed in more detail below, heat is typically not applied to the chip package 10 until the same is incorporated into a chip stack including at least one additional chip package 10.

Figure 9:
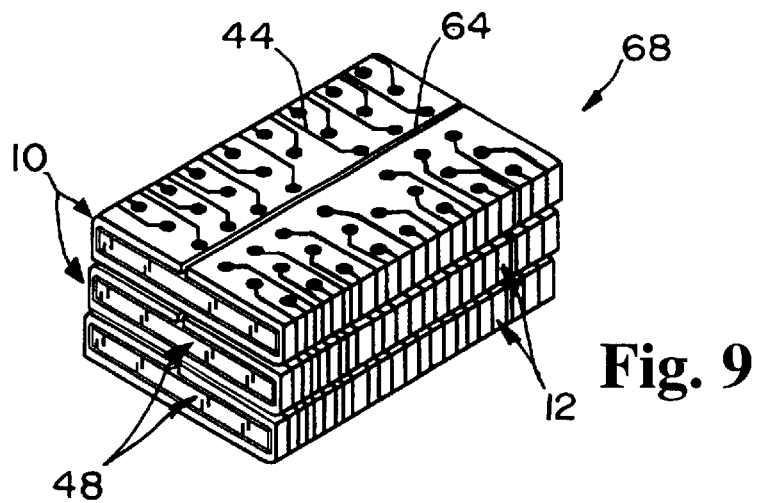
FIG. 9 is a top perspective view of a chip stack including multiple chip packages of the present invention.
Figure 10:
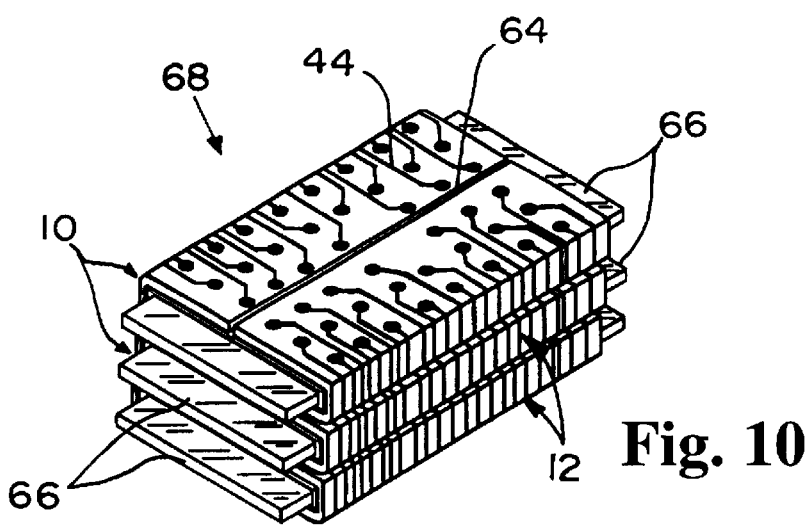
FIG. 10 is a top perspective view of a chip stack similar to that shown in FIG. 9 with the further inclusion of heat sinks on each of the chip packages.

Referring now to FIGS. 9 and 10, two or more chip packages 10 of the present invention may be assembled into a chip stack 68. In the chip stack 68, multiple chip packages 10 are stacked upon one another such that those portions of the conductive contacts 60 protruding from the flex circuit 12 in each of the chip packages 10 other than for the lowermost chip package 10 are engaged to respective ones of the third and fourth sets of pads 40, 42 of the fifth conductive pad array 62 of another chip package 10. The subsequent application of heat to the chip stack 68 facilitates a soldering process wherein the integrated circuit chips 48 of the chip packages 10 are securely mounted to respective ones of the flex circuits 12 and electrically connected to the conductive pattern thereof, and the conductive contacts 60 of the chip packages 10 other than for the lowermost chip package 10 are electrically connected to the fifth conductive pad array 62 of another chip package 10 in a manner securely mounting the chip packages 10 to each other to form the chip stack 68. To increase the strength of the electrical connections between the chip packages 10 within the chip stack 68, the third and fourth sets of pads 40, 42 of the fifth conductive pad array 62 in each chip package 10 may include additional quantities of solder paste or flux pre-applied thereto prior to the stacking of another chip package 10 thereupon.

Advantageously, the engagement between the exposed portions of the conductive contacts 60 of one chip package 10 and the third and fourth sets of pads 40, 42 of the fifth conductive pad array 62 of another chip package 10 performs a self-aligning function during the soldering process, thus simply requiring that the longitudinal and lateral edges of the chip packages 10 in the chip stack 68 be aligned with each other prior to the application of heat thereto. Though not shown, the chip packages 10 in the chip stack 68 will typically be clamped to one another prior to the application of heat thereto for purposes of maintaining the longitudinal and lateral edges of the chip packages 10 in proper registry. Such clamping may be facilitated through the use of a clip which is secured to the flex circuits 12 of the uppermost and lowermost chip packages 10 within the chip stack 68. If the chip packages 10 within the chip stack 68 are provided with the heat sinks 66 as shown in FIG. 10, such clip may be applied to the heat sinks 66 of the uppermost and lowermost chip packages 10 within the chip stack 68. Those portions of the conductive contacts 60 protruding from flex circuit 12 in the lowermost chip package 10 within the chip stack 68 may be electrically connected to respective ones of the conductive pads of a printed circuit board or mother board.

Those of ordinary skill in the art will recognize that the flex circuit 12 of the chip package 10 need not necessarily be provided with the first conductive pad array 24 in that the conductive contacts 60 of the integrated circuit chip 48 may be advanced through the cross-slits 46 within the substrate 14 and electrically mounted via soldering to only the pads 38 of the second set forming the second conductive pad array 26. Additionally, the flex circuit 12 may be adapted to be usable in conjunction with a bare die device by eliminating the cross-slits 46 and electrically connecting the pads 36 of the first set forming the first conductive pad array 24 to respective ones of the pads 38 of the second set forming the second conductive pad array 26 through the use of vias.

Additional modifications and improvements of the present invention may also be apparent to those of ordinary skill in the art. Thus, the particular combination of parts and steps described and illustrated herein is intended to represent only one embodiment of the present invention, and is not intended to serve as limitations of alternative devices within the spirit and scope of the invention.

What is claimed is:

1. A stackable integrated circuit chip package, comprising:

a flex circuit comprising:
a flexible substrate having opposed, generally planar top and bottom surfaces;
a first conductive pad array disposed on the top surface;
a second conductive pad array disposed on the bottom surface; and
third and fourth conductive pad arrays disposed on the bottom surface on opposite sides of the second conductive pad array and electrically connected thereto;

an integrated circuit chip electrically connected to the first and second conductive pad arrays;

the substrate being wrapped about at least a portion of the integrated circuit chip such that the third and fourth conductive pad arrays collectively define a fifth conductive pad array which is electrically connectable to another stackable integrated circuit chip package.

2. The chip package of claim 1 wherein:
the first conductive pad array comprises a first set of pads; and
the second conductive pad array comprises a second set of pads which are arranged in an identical pattern to the first set of pads such that the pads of the first set are aligned with respective ones of the pads of the second set.

3. The chip package of claim 2 wherein:
the third conductive pad array comprises a third set of pads;

the fourth conductive pad array comprises a fourth set of pads; and the fifth conductive pad array comprises the third and fourth sets of pads which, when the substrate is wrapped about the integrated circuit chip, are arranged in an identical pattern to the first and second sets of pads.

4. The chip package of claim 3 wherein the third and fourth sets of pads are arranged in patterns which are mirror images to each other.

5. The chip package of claim 3 further comprising a plurality of cross-slits extending through the substrate between respective pairs of the pads of the first and second sets.

6. The chip package of claim 5 wherein the integrated circuit chip comprises:

a body having opposed, generally planar top and bottom surfaces; and a plurality of conductive contacts protruding from the bottom surface of the body;

the electrical connection of the integrated circuit chip to the first and second conductive pad arrays being facilitated by the insertion of the conductive contacts into the cross-slits of respective ones of the pads of the first set and advancement therethrough to protrude from respective ones of the pads of the second set.

7. The chip package of claim 6 wherein the conductive contacts are arranged on the bottom surface of the body in an identical pattern to the first and second sets of pads.

8. The chip package of claim 6 wherein each of the conductive contacts has a generally semi-spherical configuration.

9. The chip package of claim 6 wherein:

the substrate has a generally rectangular configuration defining a pair of longitudinal peripheral edge segments and a pair of lateral peripheral edge segments;

the first and second conductive pad arrays extend between the longitudinal peripheral edge segments in spaced relation to the lateral peripheral edge segments; and the third and fourth conductive pad arrays extend between the longitudinal peripheral edge segments along respective ones of the lateral peripheral edge segments.

10. The chip package of claim 9 wherein:

the body of the integrated circuit chip has a generally rectangular configuration defining a pair of longitudinal sides and a pair of lateral sides; and the substrate is wrapped about the longitudinal sides of the body such that the fifth conductive pad array extends over the top surface of the body and the third and fourth sets of conductive pads are in substantial alignment with respective pairs of the first and second sets of pads.

11. The chip package of claim 10 wherein the substrate is sized relative to the integrated circuit chip such that the lateral peripheral edge segments of the substrate extend along the top surface of the body in generally parallel relation to each other and are separated by a narrow gap, and the lateral sides of the body are substantially flush with respective ones of the longitudinal peripheral edge segments of the substrate.

12. The chip package of claim 10 further comprising a pair of heat sinks attached to respective ones of the lateral sides of the body.

13. The chip package of claim 10 wherein the integrated circuit chip is selected from the group consisting of:

a flip chip device; and a fine pitch ball grid array (BGA) device.

14. The chip package of claim 10 wherein the substrate is attached to the top surface of the body through the use of an adhesive.

15. The chip package of claim 1 wherein the substrate of the flex circuit is fabricated from a polyamide.

* * * * *